(12) United States Patent
Smilde et al.

(10) Patent No.: US 9,081,304 B2
(45) Date of Patent: Jul. 14, 2015

(54) SUBSTRATE, AN INSPECTION APPARATUS, AND A LITHOGRAPHIC APPARATUS

(75) Inventors: Hendrik Jan Hidde Smilde, Veldhoven (NL); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 1144 days.

(21) Appl. No.: 13/059,408

(22) PCT Filed: Jul. 9, 2009

(86) PCT No.: PCT/EP2009/006473
§ 371 (c)(1),
(2), (4) Date: Apr. 28, 2011

(87) PCT Pub. No.: WO2010/025950
PCT Pub. Date: Mar. 11, 2010

(65) Prior Publication Data
US 2011/0194092 A1    Aug. 11, 2011

Related U.S. Application Data

(60) Provisional application No. 61/095,084, filed on Sep. 8, 2008.

(51) Int. Cl.
*G03B 27/42* (2006.01)
*G03F 7/20* (2006.01)

(52) U.S. Cl.
CPC ........ *G03F 7/70683* (2013.01); *G03F 7/70625* (2013.01); *G03F 7/70633* (2013.01); *Y10T 428/24802* (2015.01)

(58) Field of Classification Search
CPC ............ G03F 7/70625; G03F 7/70683; G03F 7/70633

USPC ............... 355/67, 53; 250/395, 393; 430/328; 356/400, 401
See application file for complete search history.

(56) References Cited

U.S. PATENT DOCUMENTS

| 2002/0066070 A1 | 5/2002 | Summerer |
| 2005/0219532 A1 | 10/2005 | Mason |
| 2008/0138013 A1* | 6/2008 | Parriaux ......................... 385/37 |
| 2008/0212097 A1 | 9/2008 | Mos et al. |

FOREIGN PATENT DOCUMENTS

| EP | 0 534 759 A1 | 9/1992 |
| EP | 1 628 164 A2 | 2/2006 |

OTHER PUBLICATIONS

International Preliminary Report on Patentability and Written Opinion of the International Searching Authority directed to related International Patent Application No. PCT/EP2009/006473, The International Bureau of WIPO, mailed Mar. 17, 2011; 9 pages.
International Search Report directed to related International Patent Application No. PCT/EP2009/006473, mailed Feb. 4, 2010; 3 pages.

* cited by examiner

*Primary Examiner* — Peter B Kim
(74) *Attorney, Agent, or Firm* — Sterne, Kessler, Goldstein & Fox P.L.L.C.

(57) ABSTRACT

A target for measuring an overlay error or a critical dimension of a substrate comprises a grating. In one example, lines of the grating are arranged at an angle of about 45° with respect to edges of the target. As a consequence, the diffraction order of the grating reflection has its sub-maxima not aligned along the line on which the other diffraction orders are positioned, and overlap of intensity with other diffraction orders is reduced.

14 Claims, 4 Drawing Sheets

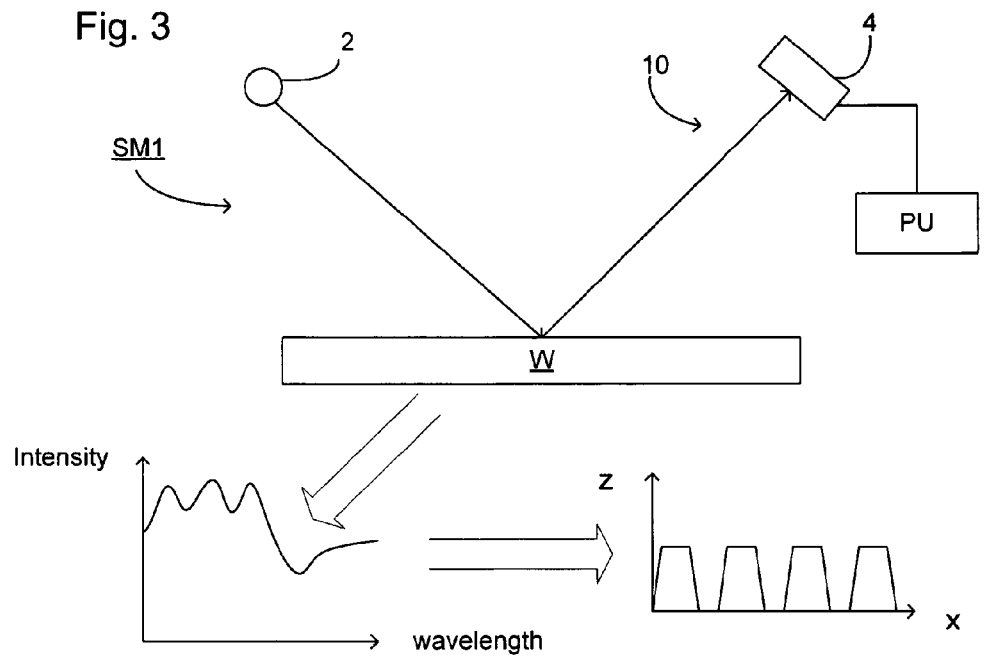
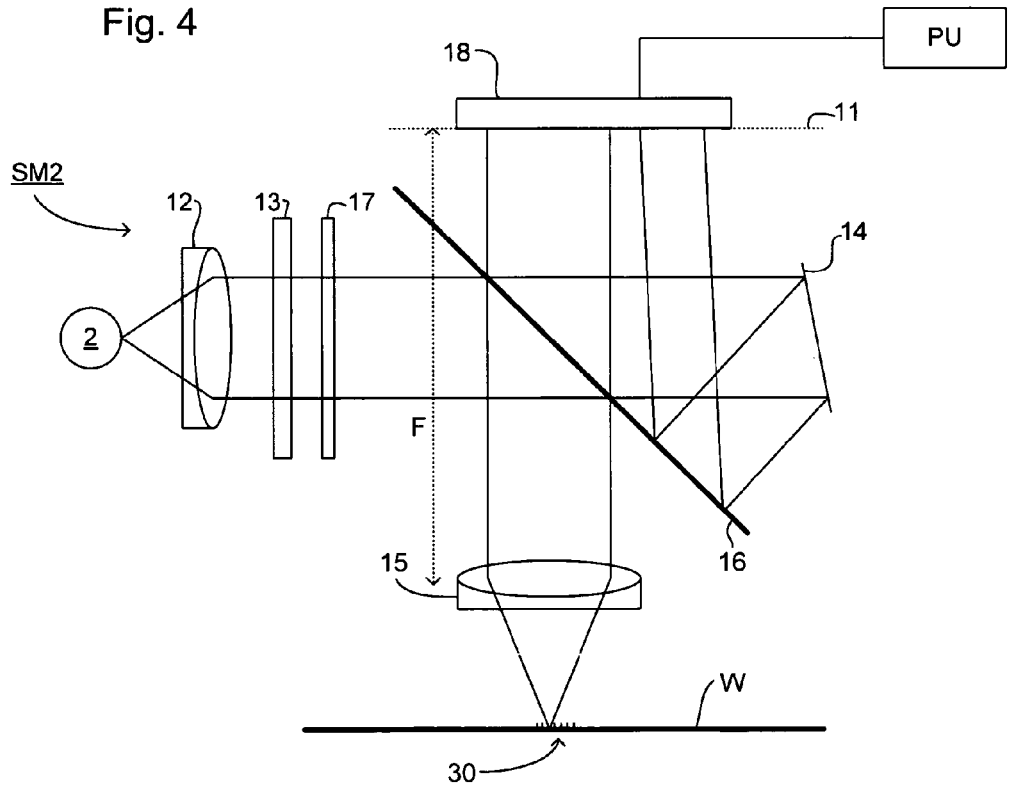

SUBSTRATE, AN INSPECTION APPARATUS, AND A LITHOGRAPHIC APPARATUS

CROSS-REFERENCE TO RELATED APPLICATIONS

This application claims the benefit of U.S. provisional application 61/095,084, which was filed Sep. 8, 2008, and which is incorporated herein in its entirety by reference.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Existing apparatus use a specific target to determine the overlay error or critical dimensions. The target usually comprises a grating and the target area is of a sufficient size to be larger than the radiation spot with which it is illuminated. Consequently, reconstruction of the grating structure is relatively simple because the target can be considered to be periodic and of infinite extent. As the target does not form part of circuit pattern it occupies an area of the substrate, which cannot then be used as part of the circuit pattern. However, space on the substrate is at a premium, and it is therefore desirable to reduce the area occupied by targets.

If the target area is reduced, then the edges of the target will fall within the edge of the radiation spot with which it is illuminated. Thus, the grating cannot be considered infinite and can be considered to be an infinite grating multiplied by a window function, with the edges of the target forming the window function.

If the grating is no longer infinite, then each diffraction order is spread, and is formed by the Fourier transform of the shape of the target as a whole. The diffraction pattern that results from the finite grating can be thought of as obtained from the diffraction pattern of the infinite grating that has been convoluted with the Fourier transform of the window function of the finite target. The smaller the size of the target, the larger the spread of each diffraction order. As a consequence of the spread of each diffraction order, the diffraction orders begin to overlap, which makes reconstructing the grating more difficult and may result in errors in the resulting calculations.

A conventional target comprising a grating is depicted in FIG. 5a of the accompanying Figures. FIG. 5b depicts the diffraction orders resulting from the grating. As can be seen in the figure, the spread (or streaking) of the diffraction orders is greatest in the x and y directions, and the different diffraction orders are also oriented along the x direction. Thus, there is some overlap between the different diffraction orders along the x (or horizontal) direction.

SUMMARY

It is desirable to minimize overlap between different diffraction orders from a target.

According to an embodiment of the invention, there is provided a substrate comprising a target. The target has a minimum diameter and at least one straight edge. The minimum diameter defines a first direction. The target comprises a pattern having a periodicity in a first repeating direction. The first repeating direction being at an angle of greater than 0° and less than 90° to the first direction.

According to another embodiment of the invention, there is provided an inspection apparatus, lithographic apparatus or lithographic cell configured to measure a property of a substrate comprising a radiation projector, a high numerical aperture lens, a detector, and a substrate. The radiation projector is configured to project radiation onto the substrate. The detector is configured to detect the radiation beam reflected from a surface of the substrate. The substrate comprises a target. The target has a minimum diameter. The minimum diameter defines a first direction. The target comprises a pattern which repeats in a first repeating direction. The first repeating direction being at an angle of greater than 0° and less than 90° to the first direction.

According to a yet further embodiment of the invention, there is provided method of measuring a property of a substrate, the method comprising the following steps. Exposing a target. Projecting radiation onto the target on the substrate. Detecting the radiation reflected by the substrate. Determining the property from the reflected radiation. The target has a minimum diameter defining a first direction. The target comprises a pattern which repeats having a periodicity in a first repeating direction. The first repeating direction being at an angle of greater than 0° and less than 90° to the first direction.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 3 depicts a first scatterometer.

FIG. 4 depicts a second scatterometer.

Figure 1:
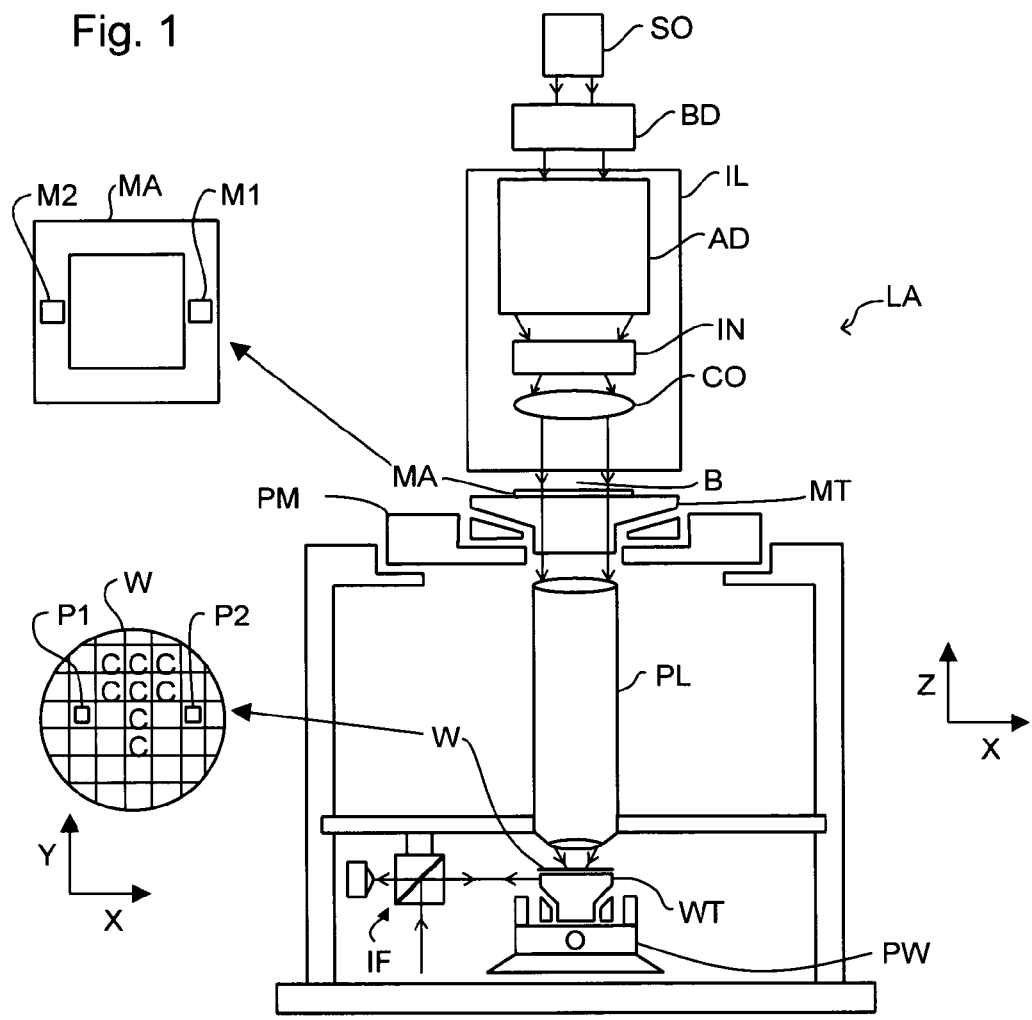
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The lithographic apparatus includes: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. The lithographic apparatus also has a projection system PS configured to project a pattern imparted to the radiation beam B by patterning device MA onto a target portion (e.g., comprising one or more dies) C of the substrate W. In the lithographic apparatus the patterning device MA and the projection system PS is transmissive, but alternatively could be reflective.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus, and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

The lithographic apparatus may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatus may be separate entities, for example when the source SO is an excimer laser. In such cases, the source SO is not considered to form part of the lithographic apparatus, and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatus—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator IL may be used to condition the radiation beam B, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatus may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.
3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Figure 2:
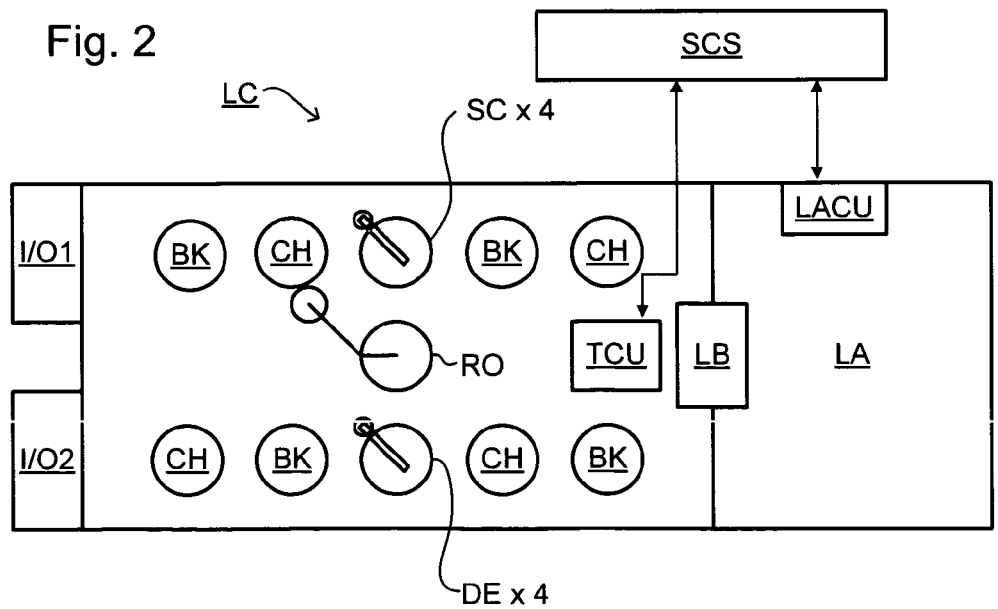
FIG. 2 depicts a lithographic cell or cluster.
Figure 5A:
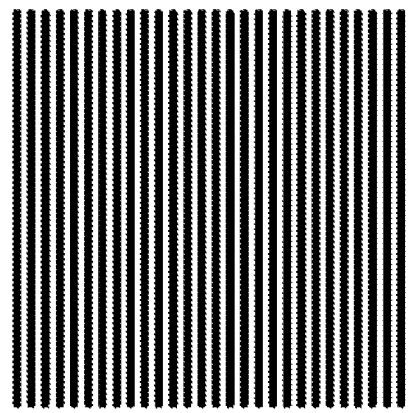
FIG. 5a depicts a target comprising a grating.
Figure 5B:
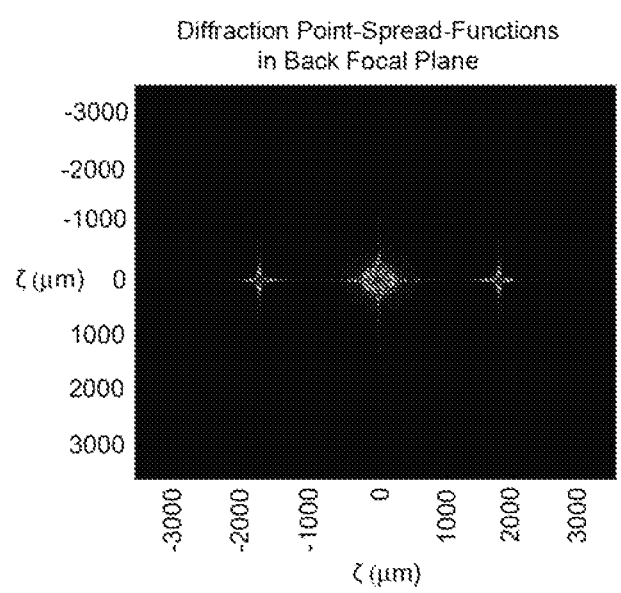
FIG. 5b depicts the diffraction from the target depicted in FIG. 5a in the back focal plane.

As shown in FIG. 2, a lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU, which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked, to improve yield, or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, i.e., there is only a very small difference in refractive index between the parts of the resist which have been exposed to radiation and those which have not, and not all inspection apparatus have sufficient sensitivity to make useful measurements of the latent image. Therefore, measurements may be taken after the post-exposure bake step (PEB), which is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

FIG. 3 depicts a scatterometer that may be used in the present invention. It comprises a broadband (white light) radiation projector 2, which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4. In this device, the radiation emitted by radiation source 2 is focused using lens system 12 through interference filter 13 and polarizer 17, reflected by partially reflected surface 16, and is focused onto substrate W via a microscope objective lens 15, which has a high numerical aperture (NA), preferably at least about 0.9 and more preferably at least about 0.95. Immersion scatterometers may even have lenses with numerical apertures over about 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, about 40 milliseconds per frame.

In one example, a reference beam is often used, for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

In one example, a set of interference filters 13 is available to select a wavelength of interest in the range of, e.g., about 405-790 nm or even lower, such as about 200-300 nm. Additionally, or alternatively, the interference filter may be tunable rather than comprising a set of different filters. In another example, a grating could be used instead of interference filters.

In various examples, the detector 18 may measure the intensity of scattered light at a single wavelength (or narrow wavelength range), the intensity separately at multiple wavelengths, or integrated over a wavelength range. Furthermore, the detector may separately measure the intensity of transverse magnetic- and transverse electric-polarized light and/or the phase difference between the transverse magnetic- and transverse electric-polarized light.

In one example, using a broadband light source (i.e., one with a wide range of light frequencies or wavelengths—and therefore of colors) is possible, which gives a large etendue, allowing the mixing of multiple wavelengths. The plurality of wavelengths in the broadband each has a bandwidth of *δ (i.e., a small proportion (*) of the wavelength (δ); e.g., of the order of about 10 nm) and a spacing of at least 2*δ (i.e. twice the bandwidth). Several "sources" of radiation can be different portions of an extended radiation source, which have been split using fiber bundles. In this way, angle resolved scatter spectra can be measured at multiple wavelengths in parallel. A 3-D spectrum (e.g., wavelength and two different angles) can be measured, which contains more information than a 2-D spectrum. This allows more information to be measured which increases metrology process robustness. This is described in more detail in EP1,628,164A, which is incorporated by reference herein in its entirety.

In one example, target 30 on substrate W may be a grating. The grating may be printed such that, after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

The common alignment of the different diffraction orders and the spread of each diffraction order resulting from the finite grating size results from the common alignment of the grating lines and the edge of the target. In one example, the grating lines are oriented at an angle of greater than about 0° and less than about 90° to the minimum dimension (or diameter) of the target. For example, the grating lines are at an angle of greater than about 20° and less than about 70° to the edges of the target, and most particularly at an angle of about 45°.

Figure 6A:
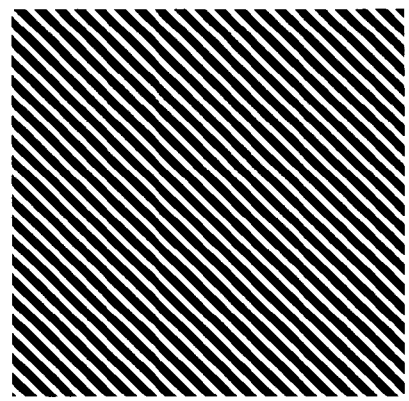
FIG. 6a depicts a target, according to the invention.

If, for instance, the edge of the target is aligned with the x-axis (or the horizontal axis when viewed as in FIG. 6a), and if the target is a rectangle or square as shown in FIG. 6a, a minimum diameter of the target is parallel with this x-axis. The grating lines are therefore oriented so as not to be parallel to this x-axis. This prevents the overlap of the spread in the x-direction.

Also in this example, there is spread in the perpendicular y-direction if a second minimum diameter of the target is perpendicular to the x-axis (i.e., parallel to the y-axis). The orientation of the periodicity of the pattern (or the "second repeating direction") within this target is therefore not parallel with the y-direction, either, and is greater than about 0° and less than about 90° to the second minimum diameter (and more particularly at an angle of greater than about 20° and less than about 70° to the edges of the target, and most particularly at an angle of about 45°).

If the target is not square or rectangular, the periodicity (or repeating direction) of the pattern still may not align with the edges of the target (i.e., is not be parallel with the minimum diameter, the minimum diameter generally being associated with a straight edge of the target). This may be because the overall shape of the target defines the direction of spread of the diffraction orders and the pattern within the target defines the relative position of the various diffraction orders. In other words, the second minimum diameter may not be aligned with the y-axis, but with a further axis along with which the repeating direction of the pattern is preferably also not be aligned.

Figure 6B:
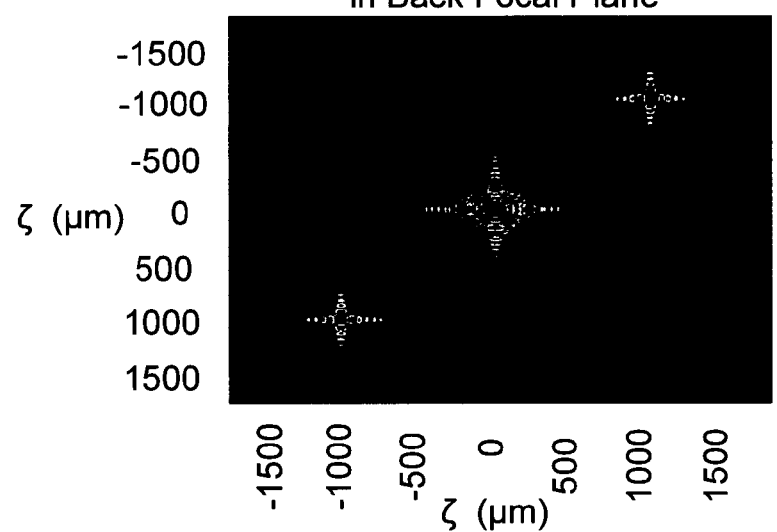
FIG. 6b depicts the diffraction from the target depicted in FIG. 6a in the back focal plane.

FIG. 6a depicts a target according to an embodiment of the invention, in which the grating lines are oriented at an angle of about 45° to the target edges and the minimum dimension (or diameter) of the target. FIG. 6b depicts the resulting diffraction in the back focal plane for the target in FIG. 6a, in one embodiment.

As can be seen, in this embodiment the diffraction orders are aligned at an angle of about 45° to the spread of the individual diffraction orders, such that the intensity overlap between the different diffraction orders is much decreased. The spread of each diffraction order along the x axis due to the finite nature of the diffraction grating is proportional to $1/x^2$ and the spread of each diffraction order along the y axis due to the finite nature of the diffraction grating is proportional to $1/y^2$. Thus, spread of the diffraction orders along the direction in which the different diffraction orders are oriented is proportional to $1/(x^2+y^2)$. In contrast, the spread of the diffraction orders along the direction in which the different diffraction orders are oriented in conventional targets is proportional to $1/x^2$. Using this embodiment of the invention, the intensity overlap between the neighboring maxima is therefore much smaller. As will be appreciated, an angle of about 45° minimizes the overlap between neighboring maxima to the greatest extent, although any angle greater than about 0° and less than 90°, and particularly between about 20° and 70°, and reduces the overlap between neighboring maxima.

In one example, as a consequence, a larger spatial band filter can be used and more accurate measurements result. In another example, a further advantage is that, with diagonally arranged grating lines, the targets can be more distinguished from the surrounding circuit pattern than conventional targets.

The above described embodiment of the invention has been illustrated using a one dimensional grating. However, it is equally applicable to two dimensional gratings, and such a target shown in FIG. 7, according to another embodiment of the present invention. In one example, any direction along which there is a repeating are oriented at a non-zero angle to the edges of the target. The target shape need not be limited to one and two dimensional gratings and may comprise any repeating pattern.

Figure 7:
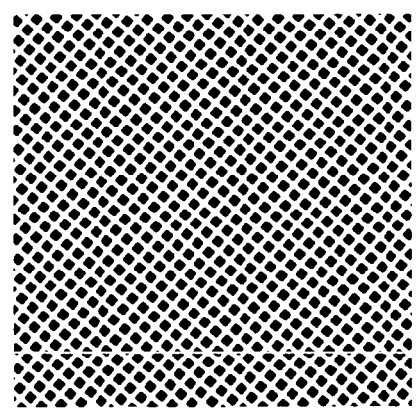
FIG. 7 depicts an alternative target, according to the invention.

It should be noted that repeating patterns, such as that shown in FIG. 7, may have two main (or principal) repeating directions (along the two diagonals in the case of FIG. 7), but will often also have sub-repeating directions (nearly along the horizontal and the vertical in FIG. 7) because of the nature of overlapping repeating patterns. This will, of course, depend on the size of the repeating units with respect to the target size and the respective angles of orientation of the overlapping patterns. In these cases, the sub-repeating directions are also not aligned with the target's minimum diameters (or the target's edges).

However, when the repeating patterns are two-dimensional patterns as shown in FIG. 7, it is more important to have the principal repeating directions at an angle to the target edges than other (sub-)repeating directions. This is because the principal repeating directions will be the patterns that give rise to the lowest diffraction orders, which provide the most information in an inspection apparatus.

For example, a two-dimensional periodic structure is often referred to as being made up of unit cells that are repeated periodically in two-dimensional space. The unit cells may take several different forms, depending on the orientation of a grating, for instance. In the embodiment shown in FIG. 7, the unit cell is a small square that is repeated throughout the target. When radiation is diffracted through the two-dimensional (diffraction) pattern, a two-dimensional reciprocal lattice is created that is made up of a lattice of points. In FIG. 6b, a one-dimensional "lattice" of points is shown in the reciprocal lattice of the grating of FIG. 6a. The points in the reciprocal lattice are commonly called diffraction orders. The most central point (i.e., a point nearest the origin of the two-dimensional space) may be the "zeroth" diffraction order, the next points outwards in the lattice may be first diffraction orders, the next points, the second diffraction orders, etc. In metrology applications (such as the inspection apparatus), the lower diffraction orders (e.g., up to the second orders) are the most interesting because they give rise to the most information about the target because they represent the smallest diffraction angles of the diffracted radiation. These smaller angles are most easily detected by the detector because these are partly or completely within the aperture of detection of the detector in an optical scatterometry set-up. Higher diffraction orders that are associated with less important repeating directions are not so easily detected. These less important repeating directions may therefore be aligned with the target edges if this allows the optimization of the angle (with respect to the target edges) of the principal repeating directions.

Similarly, the target need not be square or rectangular in shape, but the direction along which the pattern repeats should be oriented at a non-zero angle to the minimum diameter across the target.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   forming a target on a substrate;
   projecting a spot of radiation onto the target on the substrate;
   detecting the radiation diffracted by the substrate; and
   determining a property of the target from the diffracted radiation,
   wherein the target comprises:
      a first dimension between opposing edges of the target along a first direction, the first dimension being a minimum with respect to other dimensions between the opposing edges of the target along other directions, and
      a pattern within the edges, the pattern comprising a periodicity in a first repeating direction, wherein:
         the first repeating direction is at an angle greater than about 0° and less than about 90° to the first direction;
         one or more diffraction orders of the different diffraction orders that comprise smallest angles of diffraction among the different diffraction orders are oriented along the first repeating direction; and
         a spread of each of the different diffraction orders is largest along the first direction and unaligned with the first repeating direction in response to the spot of radiation being larger than the minimum dimension.

2. An inspection apparatus comprising:
   a radiation projector configured to project a spot of radiation onto a substrate;
   a high numerical aperture lens; and
   a detector configured to detect the radiation beam diffracted from a surface of the substrate,
   wherein the substrate comprises a target, the target comprising:
      a first dimension between opposing edges of the target along a first direction, the first dimension being a minimum with respect to other dimensions between the opposing edges of the target along other directions; and
      a pattern within the edges, the pattern comprising a periodicity in a first repeating direction, wherein:
         the first repeating direction is at an angle greater than about 0° and less than about 90° to the first direction;
         one or more diffraction orders of the different diffraction orders that comprise smallest angles of diffraction among the different diffraction orders are oriented along the first repeating direction; and
         a spread of each of the different diffraction orders is largest along the first direction and unaligned with the first repeating direction in response to the spot of radiation being larger than the minimum dimension.

3. An inspection apparatus comprising:
   a radiation projector configured to project a spot of radiation beam onto a substrate;
   a high numerical aperture lens;
   a detector configured to detect the radiation beam diffracted from a surface of the substrate; and a data processor configured to determine a parameter of a target on the substrate, the target comprising:
  a first dimension between opposing edges of the target along a first direction, the first dimension being a minimum with respect to other dimensions between the opposing edges of the target along other directions; and
  a pattern within the edges, the pattern comprising a periodicity in a first repeating direction, wherein:
    the first repeating direction is at an angle greater than about 0° and less than about 90° to the first direction;
    one or more diffraction orders of the different diffraction orders that comprise smallest angles of diffraction among the different diffraction orders are oriented along the first repeating direction; and
    a spread of each of the different diffraction orders is largest along the first direction and unaligned with the first repeating direction in response to the spot of radiation being larger than the minimum dimension.

4. A lithographic apparatus comprising:
an illumination optical system configured to illuminate a pattern;
a projection optical system configured to project an image of the pattern on to a substrate; and
an inspection apparatus comprising:
  a radiation projector configured to project a spot of radiation beam onto a substrate;
  a high numerical aperture lens;
  a detector configured to detect the radiation beam diffracted from a surface of the substrate; and
  a data processor configured to determine a parameter of a target on the substrate, the target comprising:
    a first dimension between opposing edges of the target along a first direction, the first dimension being a minimum with respect to other dimensions between the opposing edges of the target along other directions; and
    a pattern within the edges, the pattern comprising a periodicity-in a first repeating direction, wherein:
      the first repeating direction is at an angle greater than about 0° and less than about 90° to the first direction;
      one or more diffraction orders of the different diffraction orders that comprise smallest angles of diffraction among the different diffraction orders are oriented along the first repeating direction; and
      a spread of each of the different diffraction orders is largest along the first direction and unaligned with the first repeating direction in response to the spot of radiation beam being larger than the minimum dimension.

5. A target configured to produce a diffraction pattern comprising different diffraction orders in response to being illuminated by a spot of radiation, the target comprising:
  a first dimension between opposing edges of the target along a first direction, the first dimension being a minimum with respect to other dimensions between the opposing edges of the target along other directions; and
  a pattern located within the target comprising a first periodicity in a first repeating direction, wherein:
    the first repeating direction is at an angle greater than about 0° and less than about 90° to the first direction;
    one or more diffraction orders of the different diffraction orders that comprise smallest angles of diffraction among the different diffraction orders are oriented along the first repeating direction; and
    a spread of each of the different diffraction orders is largest along the first direction and unaligned with the first repeating direction in response to the spot of radiation being larger than the minimum dimension.

6. The target of claim 5, wherein the angle is greater that about 30° and less than about 60°.

7. The target of claim 5, wherein the angle is about 45°.

8. The target of claim 5, wherein the pattern further comprises a second periodicity in a second repeating direction, the second repeating direction being different from the first repeating direction, the first and second repeating directions each being at an angle greater than about 0° and less than about 90° to the first direction.

9. The target of claim 5, comprising a rectangular shape, wherein the minimum dimension is a length of a shortest side of the rectangular shape.

10. The target of claim 5, wherein the pattern comprises a grating.

11. A method comprising:
projecting a spot of radiation onto the target on the substrate;
detecting radiation diffracted by the target on a substrate; and
determining a property of the target from the diffracted radiation,
wherein the target comprises:
  a first dimension between opposing edges of the target along a first direction. the first dimension being a minimum with respect to other dimensions between the opposing edges of the target along other directions; and
  a pattern within the edges, the pattern comprising a periodicity in a first repeating direction, wherein:
    the first repeating direction is at an angle greater than about 0° and less than about 90° to the first direction;
    one or more diffraction orders of the different diffraction orders that comprise smallest angles of diffraction among the different diffraction orders are oriented along the first repeating direction; and
    a spread of each of the different diffraction orders is largest along the first direction and unaligned with the first repeating direction in response to the spot of radiation being larger than the minimum dimension.

12. An inspection apparatus comprising:
a radiation projector configured to project a spot of radiation onto a substrate:
a detector configured to detect the radiation diffracted from a surface of the substrate; and
a target on the substrate, the target comprising:
  a first dimension between opposing edges of the target along a first direction, the first dimension being a minimum with respect to other dimensions between the opposing edges of the target along other directions; and
  a pattern within the edges, the pattern comprising a periodicity in a first repeating direction, wherein:
    the first repeating direction is at an angle greater than about 0° and less than about 90° to the first direction;
    one or more diffraction orders of the different diffraction orders that comprise smallest angles of diffraction among the different diffraction orders are oriented along the first repeating direction; and a spread of each of the different diffraction orders is largest along the first direction and unaligned with the first repeating direction in response to the spot of radiation being larger than the minimum dimension.

13. An inspection apparatus comprising:
a radiation projector configured to project a spot of radiation beam onto a substrate;
a detector configured to detect the radiation beam diffracted from a surface of the substrate; and
a processor configured to determine a parameter of a target on the substrate, wherein the target comprises:
  a first dimension between opposing edges of the target along a first direction, the first dimension being a minimum with respect to other dimensions between the opposing edges of the target along other directions; and
  a pattern within the edges, the pattern comprising a periodicity in a first repeating direction, wherein:
    the first repeating direction is at an angle greater than about 0° and less than about 90° to the first direction;
    one or more diffraction orders of the different diffraction orders that comprise smallest angles of diffraction among the different diffraction orders are oriented along the first repeating direction; and
    a spread of each of the different diffraction orders is largest along the first direction and unaligned with the first repeating direction in response to the spot of radiation beam being larger than the minimum dimension.

14. A lithographic apparatus comprising:
a projection optical system configured to project an image of a pattern onto a substrate; and
an inspection apparatus comprising:
  a radiation projector configured to project a spot of radiation beam onto the substrate;
  a detector configured to detect the radiation beam diffracted from a surface of the substrate; and
  a processor configured to determine a parameter of a target on the substrate, the target comprising:
    a first dimension between opposing edges of the target along a first direction, the first dimension being a minimum with respect to other dimensions between the opposing edges of the target along other directions; and
    a pattern within the edges, the pattern comprising a periodicity in a first repeating direction, wherein:
      the first repeating direction is at an angle greater than about 0° and less than about 90° to the first direction;
      one or more diffraction orders of the different diffraction orders that comprise smallest angles of diffraction among the different diffraction orders are oriented along the first repeating direction; and
      a spread of each of the different diffraction orders is largest along the first direction and unaligned with the first repeating direction in response to the spot of radiation beam being larger than the minimum dimension.

\* \* \* \* \*

UNITED STATES PATENT AND TRADEMARK OFFICE
CERTIFICATE OF CORRECTION

PATENT NO. : 9,081,304 B2
APPLICATION NO. : 13/059408
DATED : July 14, 2015
INVENTOR(S) : Smilde et al.

It is certified that error appears in the above-identified patent and that said Letters Patent is hereby corrected as shown below:

Title Page, Item (22), after "PCT Filed:" please delete "Jul. 9, 2009" and insert --September 7, 2009--.

Signed and Sealed this
Twenty-first Day of June, 2016

Michelle K. Lee
*Director of the United States Patent and Trademark Office*